United States Patent [19]
Koontz

[11] Patent Number: 5,334,957
[45] Date of Patent: Aug. 2, 1994

[54] RF HIGH POWER, TWO AND THREE WAY IN PHASE COMBINER AND METHOD

[75] Inventor: Floyd A. Koontz, Holcomb, N.Y.
[73] Assignee: Harris Corporation, Melbourne, Fla.
[21] Appl. No.: 973,650
[22] Filed: Nov. 9, 1992
[51] Int. Cl.$^5$ .................................. H03H 7/38
[52] U.S. Cl. ........................ 333/131; 333/129; 336/170
[58] Field of Search ............ 333/131, 124, 117, 129; 336/170; 323/356, 361; 455/103, 105

[56] References Cited

U.S. PATENT DOCUMENTS

| | | | |
|---|---|---|---|
| 3,091,743 | 1/1960 | Wikinson | 333/9 |
| 3,428,920 | 2/1964 | Oleksiak | 333/8 |
| 3,697,895 | 10/1972 | Beck | 333/8 |
| 3,747,026 | 6/1973 | Covill | 333/100 |
| 3,784,931 | 1/1974 | Covill | 333/100 |
| 4,190,816 | 2/1980 | Moss et al. | 333/131 |
| 4,554,518 | 11/1985 | Baer | 333/33 |
| 5,097,234 | 3/1992 | Andresen | 333/119 |

Primary Examiner—Robert J. Pascal
Assistant Examiner—Darius Gambino
Attorney, Agent, or Firm—Rogers & Killeen

[57] ABSTRACT

Two unequal impedance input port RF power combiner is used alone or as a component of a three equal input impedance input port RF power combiner with isolation between all ports. The combiner has a band pass of at least two octaves and the capacity to handle at least 5 kw. The combiner may be used in a transmission system and methods of isolation of the input ports by the resistive shunting of selected transformer windings are disclosed.

40 Claims, 1 Drawing Sheet

RF HIGH POWER, TWO AND THREE WAY IN PHASE COMBINER AND METHOD

BACKGROUND OF THE INVENTION

RF power combiners, with odd number of input ports, are generally of the "Wilkinson" type as initially described in the article "An N-Way Hybrid Power Divider", *IRE Transactions On Microwave Theory and Techniques*, Vol. MTT-8, pp. 116–118, Jan. 1960 as well as in U.S. Pat. No. 3,091,743 dated May 28, 1963. Such combiners obtain input port-to-port isolation for each port by feeding each of the other ports with the signal applied to any one port through resistors with a 180 degree phase shifted voltage, with one-quarter wavelength transmission lines providing the 180 degree phase shift required for cancellation. At the frequencies of interest, e.g., 30 MHz, the physical length of the one-quarter wavelength transmission lines becomes impractical for many applications.

As an alternative, Wilkinson type combiners have been built using ferrite transformers instead of the one-quarter wavelength transmission lines. Such a combiner is described in the U.S. Pat. No. 3,428,920 dated 1969. Excellent port-to-port isolation can be obtained at very low power (less than one watt) for bandwidths of 30 MHz or less. However, the phase shift and amplitude must be carefully controlled as a function of the frequency of the signals combined when a wide bandwidth is desired.

The ferrite core technique has been described in the Motorola *RF Device Data Manual*, Vol. 2, pp. 7-102 to 7-105, with short transmission lines loaded with ferrite to minimize the additional phase shift in low power applications, e.g., a few hundred watts. However, when the ferrite cored transformers are required to handle kilowatts of power, the increase in size results in excessive phase delays with significant deterioration in port-to-port isolation.

It is accordingly an object of the present invention to obviate many of the problems of the known prior art and to provide a novel power combiner and method with excellent port-to-port isolation.

A further object of the present invention is to provide a novel RF power combiner and method which maintains port-to-port isolation over a significant bandwidth e.g., 30 MHz.

It is another object of the present invention to provide a novel RF combiner and method capable of handling five kilowatts or more of power.

It is yet another object of the present invention to provide a novel combiner and method of maintaining port-to-port isolation between two ports of unequal impedance.

It is yet a further object of the present invention to provide a novel RF power combiner and method which maintains port-to-port isolation between three ports of equal impedance.

It is still a further object of the present invention to provide a novel RF combiner and method which significantly reduces the number of transformers required.

It is yet still a further object of the present invention to provide a novel RF transmission system in which the output signals from three amplifiers (driven by one or more exciters) with equal output impedance are selectively combined for application to a single antenna with the same input impedance.

These and many other objects and advantages of the present invention will be readily apparent to one skilled in the art from a perusal of the appended claims when read in conjunction with the detailed description and accompanying drawings.

A DESCRIPTION OF PREFERRED EMBODIMENTS

Figure 1:
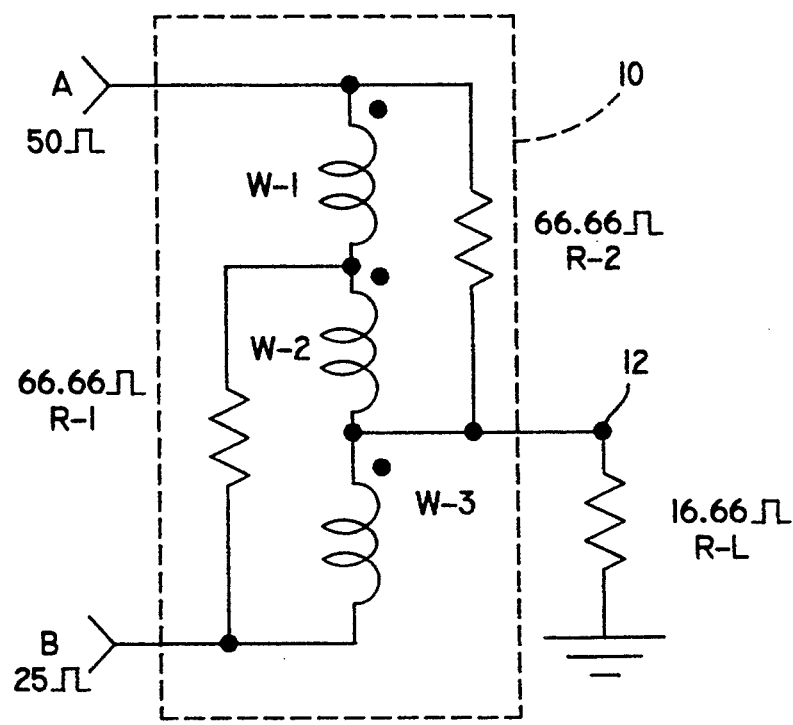
FIG. 1 is a schematic circuit diagram of one embodiment of a two, unequal impedance, input port combiner of the present invention.

In the preferred embodiment of FIG. 1, a transformer comprising three, closely coupled, equal length windings W-1, W-2 and W-3 is illustrated between a 50 ohm input Port A and a 25 ohm input Port B. A resistor R-1 is illustrated as shunting the windings W-2 and W-3 and an equal value resistor R-2 in shunting the windings W-1 and W-2. The interconnection of two of the windings, i.e., either the interconnection of windings W-1 and W-2, or alternatively W-2 and W-3, is connected to a load resistor R-L.

In the embodiment illustrated, the impedance of input Port A is twice that of input Port B, the resistors R-1 and R-2 are both eight-thirds of the value of the impedance of input Port B, and the load resistor R-L is two-thirds the value of the impedance of input Port B. It has been found desirable to closely couple the windings W-1, W-2, and W-3 by the use of a trifilar winding.

With continued reference to FIG. 1, and as shown in Table 1 below, the application of an input signal at input Port A at a voltage of 50 volts and a current of one amp provides 50 watts of power. Table 1 is a table of the current, voltage and power at various points in the circuit of FIG. 1 with an input signal only on Port A. The circuit between the input Port A and the load resistor R-L resistively comprises parallel resistors R-1 and R-2 of equal value. The one amp current from input Port A thus divides equally and recombines in the load resistor R-L. Thus, as shown in Table 1, the current passing through the parallel branch comprising W-1, R-2 and W-3 is 0.5 amp, as is the current passing through the parallel branch comprising R-2 and no current flows through the center winding W-2. The effective resistance of the parallel circuit comprising resistors R-1 and R-2 is one-half that of the load R-L. Thus, the voltage drop across the parallel path and the load resistor is equal. With reference to Table 1, the application of 50 watts of power to input Port A provides 16.7 watts of power at the load resistor.

TABLE 1

|     | I  | V    | W    |
| --- | -- | ---- | ---- |
| A   | 1  | 50   | 50   |
| B   | 0  | 0    | 0    |
| W-1 | .5 | 16.7 | 0    |
| W-2 | 0  | 16.7 | 0    |
| W-3 | .5 | 16.7 | 0    |
| R-1 | .5 | 33.3 | 16.7 |
| R-2 | .5 | 33.3 | 16.7 |
| R-L | 1  | 16.7 | 16.7 |

Because the current flowing into the input Port B through W-1 and R-2 is equal to the 0.5 amp flowing out of the input Port B through winding W-3, input Port B is effectively isolated from the signal applied to the input Port A.

All of the power applied to the input Port A does not appear at the load resistor because of the losses in the windings and resistors necessary to achieve port to port isolation when only one port receives an input signal.

Similarly, as shown in Table 2 below, an input signal of 25 volts and 1 amp on input Port B will produce 25 watts of power. Table 2 is a table of the current, voltage and power at various points in the circuit of FIG. 1 with an input signal only on Port B. In the absence of a signal on input Port A, the one amp of current from Port B divides between a first current path (comprising of R-1, W-1 and R-2) and a second current path (comprising winding W-3) before recombining at the load R-L.

TABLE 2

|     | I  | V    | W    |
|-----|----|------|------|
| A   | 0  | 0    | 0    |
| B   | 1  | 25   | 25   |
| W-1 | .5 | 4.2  | 0    |
| W-2 | 0  | 4.2  | 0    |
| W-3 | .5 | 4.2  | 0    |
| R-1 | .5 | 8.3  | 4.2  |
| R-2 | .5 | 8.3  | 4.2  |
| R-L | 1  | 16.7 | 16.7 |

Since the current from input Port B flowing through R-1 and W-1 to Port A is the same as the current flowing out of Port A through resistor R-2, input Port A is isolated from a signal appearing on Port B.

With continued reference to FIG. 1, it may be seen from Table 3 below that a 50 watt signal applied to input Port A and a 100 watt signal applied to input Port B effectively cancels the current in the shunting resistors R-1 and R-2 and provides a 3 amp signal through the load resistor and thus a 150 watt output. Table 3 is a table of the current, voltage and power at various points in the circuit of FIG. 1 with in-phase input signals on both Port A and Port B. Because the ampere turns are equal and opposite, there is no flux in the core and no series inductance or voltage drop. Thus all of the power applied to the combiner is available at the load resistor.

TABLE 3

|     | I | V  | W   |
|-----|---|----|-----|
| A   | 1 | 50 | 50  |
| B   | 2 | 50 | 100 |
| W-1 | 1 | 0  | 0   |
| W-2 | 1 | 0  | 0   |
| W-3 | 2 | 0  | 0   |
| R-1 | 0 | 0  | 0   |
| R-2 | 0 | 0  | 0   |
| R-L | 3 | 50 | 150 |

Figure 2:
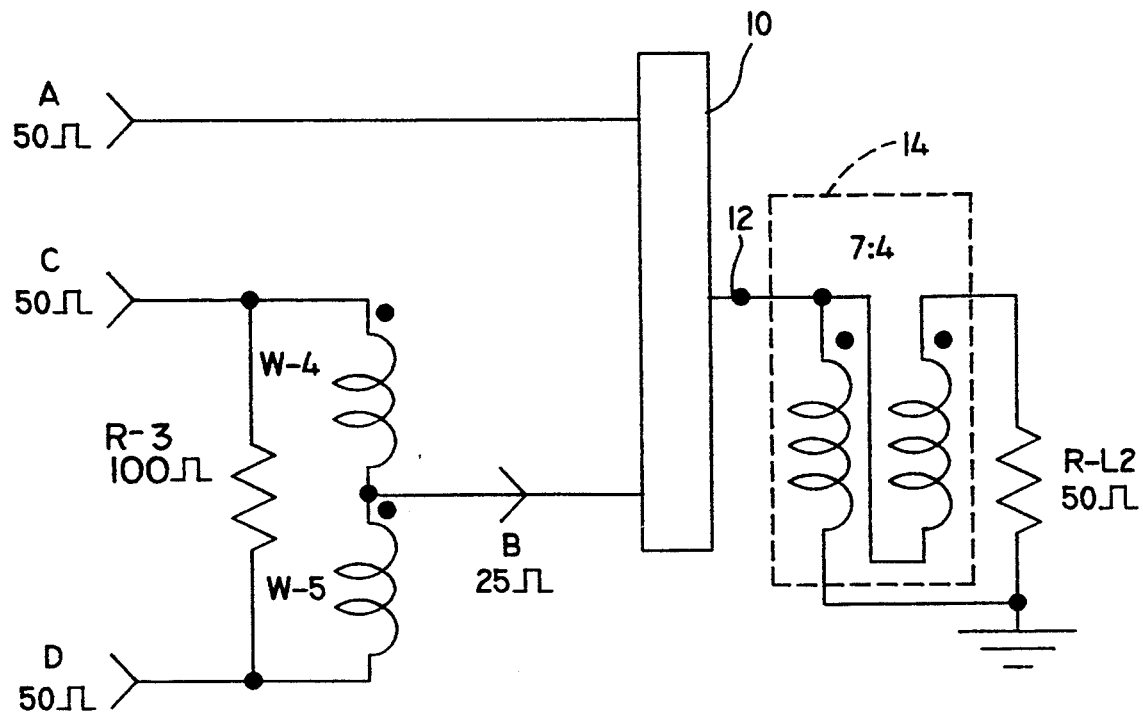
FIG. 2 is a schematic circuit diagram illustrating the use of the combiner of FIG. 1 in one embodiment of a three, equal impedance, input port combiner of the present invention.

With reference to FIG. 2 and Table 4 below, the two input port unequal input impedance combiner 10 of FIG. 1 may be used as a component in the three input port, equal input impedance combiner of FIG. 2. Table 4 is a table of the current, voltage and power at various points in the circuit of FIG. 2. As shown in FIG. 2, two 50 ohm input ports C and D are connected at opposite ends of a center tapped highly coupled transformer comprising windings W-4 and W-5 and across a shunting resistor R-3 of 100 ohms.

TABLE 4

|     | I | V  | W   |
|-----|---|----|-----|
| A   | 1 | 50 | 50  |
| B   | 2 | 50 | 100 |
| C   | 1 | 50 | 50  |
| D   | 1 | 50 | 50  |
| W-4 | 1 | 0  | 0   |
| W-5 | 1 | 0  | 0   |
| R-3 | 0 | 0  | 0   |
| R-L | 3 | 50 | 150 |

When equal value in phase voltages are applied to the input terminals C and D of FIG. 2, the voltage at terminal B will be the same value at one-half the impedance and twice the current. Since the windings W-4 and W-5 have equal and opposite ampere turns, no flux is produced in the core and no significant series inductance exists.

The terminal B of the center tap of the transformer provides a 25 ohm impedance terminal which may be used as the 25 ohm input indicated as Port B of the coupler of FIG. 1 as earlier described.

The 16.66 ohm of the output terminal 12 of FIGS. 1 and 2 may be stepped up by a transformer 14 in FIG. 2 to match a load resistor R-L of 50 ohms. The transformer 14 may be of any suitable conventional type, such as a conventional tightly coupled transformer having a 7:4 turns ratio, or the type illustrated in the Baer U.S. Pat. No. 4,554,518 issued Nov. 19, 1985, or a non-integer turns ratio transformer.

The combiner of the present invention is limited in frequency only by the bandwidth of the transformer which may be constructed with an air core or a suitable magnetic material such as powered iron or ferrite. Systems have been built covering at least 2-9 MHz and 9-30 MHz.

One application for the combiner is as a component of a transmission system. For example, shipboard RF communications systems may have one or more exciters driving three amplifiers at the same or different frequencies. With the combiner of the present invention, one, two or all three of the output signals from these amplifiers may be combined for application to a single antenna. Thus, for example, three 4 KW signals may be selectively combined to provide 12 KW peak envelope power to the antenna.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. An isolated input, two unequal port in-phase RF power combiner comprising:
    a X-ohm input terminal;
    a 2X-ohm input terminal;
    a trifilar winding transformer connected across said input terminals, said winding being tapped to provide first, second and third windings;
    a first 8X/3-ohm resistor connected across said first and second windings;
    a second 8X/3-ohm resistor connected across said second and third windings; and
    a 2X/3-ohm load connected to the interconnection of two of said three windings.

2. The combiner of claim 1 wherein said first resistor is connected to said load.

3. An isolated input, two port, in-phase RF power combiner comprising:
   first and second input terminals of significantly different input impedance;
   a transformer winding connected across said input terminals, said winding being tapped to provide first, second and third tightly coupled windings;
   first and second equal value resistors connected respectively across adjacent ones of said three windings; and,
   a load connected to the interconnection of two of said three windings.

4. The combiner of claim 3 wherein the impedance ratio of said first and second input terminals is 2:1.

5. The combiner of claim 3 wherein said transformer has a bandpass of more than two octaves and the capacity to handle more than 4 kw.

6. The combiner of claim 3 wherein said transformer has an air core.

7. The combiner of claim 3 wherein the core of said transformer includes a magnetic material.

8. The combiner of claim 3 wherein said transformer has no transmission line elements.

9. An isolated input, two unequal port in-phase RF power combiner having a bandwidth of at least two octaves and the capacity for handling at least 5 kw of power comprising:
   first and second input terminals of significantly different impedance;
   a transformer winding connected across said input terminals, said winding being tapped to provide first, second and third tightly coupled windings of equal turns;
   first and second equal value resistors connected respectively across a first and a second pair of said three windings; and,
   a load connected to the interconnection of two of said three windings.

10. The combiner of claim 9 wherein the impedance ratio of said first input terminal, said second input terminal and said load is 2:1:2/3.

11. The combiner of claim 9 wherein said transformer has no ferrite in its core and no inductive element exceeding in length ⅛ of the wavelength of the highest frequency in said two octaves.

12. A two port, unequal input impedance, RF power combiner with the capacity for handling at least 5 kw of power without adversely affecting the isolation of the input ports comprising:
   two input ports of significantly differing impedance;
   a transformer connected between said two input ports having three series connected, closely coupled windings; and
   first and second impedance means connected respectively across adjacent pairs of said three windings.

13. The combiner of claim 12 wherein the ratio of the impedance of said input ports is 2:1;
   wherein said windings are of equal length; and
   wherein said first and second impedance means are resistors of equal value.

14. The combiner of claim 13 wherein the isolation of the input ports is not adversely affected by the combining of at least 12 kw of power.

15. The combiner of claim 13 wherein the isolation of the input ports is not adversely affected by the combining of at least 30 kw of power.

16. A three equal impedance input port RF power combiner having significant isolation between the input ports comprising:
   first, second and third X-ohm input terminals;
   a two winding, center tapped transformer connected across said first and said second input terminals;
   a tightly coupled, three equal winding transformer connected between said third input terminal and the center tap of said two winding transformer;
   first and second 4/3X-ohm resistors connected respectively across adjacent pairs of the windings of said three winding transformer;
   a X-ohm load impedance: and
   a non-integer turns ratio transformer means for coupling the interconnection of two of the three windings of said three winding transformer to said load impedance.

17. The coupler of claim 16 wherein the non-integer transformer has a non-integer turns ratio.

18. The coupler of claim 16 wherein the non-integer transformer is a Wilkinson combiner.

19. The coupler of claim 16 wherein the non-integer transformer is a band pass transformer.

20. The coupler of claim 16 wherein said two winding transformer is bifilar; and
   wherein said three winding transformer is trifilar.

21. The combiner of claim 16 wherein neither said two winding nor said three winding transformer has significant magnetic material in a core.

22. The combiner of claim 16 wherein the combiner has a bandwidth of at least two octaves; and
   wherein none of said windings has a length greater than ⅛ of the wavelength of the highest frequency in said at least two octave bandwidth.

23. A three port, equal input impedance, RF power combiner with the capacity for handling at least 5 kw of power without adversely affecting the isolation of the input ports comprising:
   three input ports of the same impedance;
   a first closely coupled center tapped transformer connected between two of said three input ports;
   a second closely coupled, three winding transformer connected between the third one of said input ports and the center tap of said first transformer; and
   a third non-integer turns ratio transformer connected to the interconnection of two of the windings of said second transformer.

24. The combiner of claim 23 wherein said windings of said second transformer are of equal length; and
   wherein adjacent pairs of the windings of said second transformer are paralleled by resistors of equal value.

25. The combiner of claim 24 wherein the combiner has a bandwidth of at least four octaves;
   wherein none of said windings has a length greater than ⅛ of the wavelength of the highest frequency in said at least four octave bandwidth; and
   wherein the isolation of the input ports is not adversely affected by the combining of at least 12 kw of power.

26. The combiner of claim 25 wherein the isolation of the input ports is not adversely affected by the combining of at least 30 kw of power.

27. A method of combining RF power from two ports of unequal input impedance with isolation between them comprising the steps of:

a) providing two input terminals of Z1 and Z2 impedance respectively where Z1 differs significantly from Z2;
b) applying an in-phase input signals of W1 and W2 power respectively to the two input terminals; and
c) combining in a transformer the two input signals to provide a first signal of W1+W2 power at Z1/3 or Z2/3 impedance without adversely affecting the isolation between the two ports.

28. The method of claim 27 wherein W1+W2 equals at least 5 kw.

29. The method of claim 27 wherein W1+W2 equals at least 25 kw.

30. A method of combining RF power from three ports of equal input impedance with isolation between them comprising the steps of:
a) providing three input terminals of Z impedance each;
b) applying an in-phase input signals of W1, W2 and W3 power respectively to the three input terminals;
c) combining in a first transformer two of the three input signals to provide a first signal of W1+W2 power at Z/2 impedance without adversely affecting the isolation between those two ports; and
d) combining in a second and a third transformer the third input signal and the first signal to provide an output signal of W−1+W−2+W−3 power at Z impedance without adversely affecting the isolation of any one or more of the three ports.

31. The method of claim 30 wherein step (d) includes an impedance transformation in said third transformer, and
wherein the third transformer is a non-integer turns ratio transformer.

32. The method of claim 30 wherein W−1+W−2+W−3 equals at least 5 kw.

33. The method of claim 30 wherein W−1+W−2+W−3 equals at least 25 kw.

34. The method of isolating each of the two input ports to a RF coupler comprising the steps of:
(a) applying an RF input signal to an input port at opposite ends of three series connected, tightly coupled windings; and
(b) providing resistive shunts across adjacent pairs of the three windings.

35. The method of claim 34 wherein the three windings are of equal length and the resistive shunts are of equal impedance.

36. The method of claim 34 wherein the input impedance of the two ports has a ratio of 2:1.

37. The method of isolating each of the three input ports to a RF coupler comprising the steps of:
(a) applying a RF input signal to two of the three input ports at opposite ends of a center tapped, tightly coupled winding paralleled by a resistor to provide a fourth signal;
(b) applying a third RF input signal to the third input port and the fourth signal to opposite ends of three series connected, tightly coupled windings; and
(c) providing shunts of equal resistive value across adjacent pairs of the three windings.

38. The method of claim 37 including the further step of applying an output signal from the interconnection of two of the three windings across a load by way of a non-integer transformer.

39. A RF transmission system for plural transmitters with isolation between the transmitters comprising:
first, second and third sources of a RF signal with equal output impedances and a cumulative output power equal to at least 5 kw;
an RF antenna with an input impedance equal to the output impedances of said three sources;
a combiner operatively connected between said three sources and said antenna, said combiner consisting of three transformers each having a bandwidth of at least two octaves.

40. The RF transmission system of claim 1 wherein the output impedance of said sources and the input impedance of said antenna are approximately 50 ohms; and
wherein the output power of each of said three sources is approximately 4 kw.

* * * * *